US007897417B2

(12) United States Patent
Bensebaa et al.

(10) Patent No.: US 7,897,417 B2
(45) Date of Patent: Mar. 1, 2011

(54) HYBRID NANOCOMPOSITE SEMICONDUCTOR MATERIAL, AND METHOD OF PRODUCING INORGANIC SEMICONDUCTOR THEREFOR

(75) Inventors: Farid Bensebaa, Gatineau (CA); Pascal L'Ecuyer, Montréal (CA); Jianfu Ding, Gloucester (CA); Andrea Firth, Ottawa (CA)

(73) Assignee: National Research Council of Canada, Ottawa (CA)

( * ) Notice: Subject to any disclaimer, the term of this patent is extended or adjusted under 35 U.S.C. 154(b) by 235 days.

(21) Appl. No.: 11/988,646

(22) PCT Filed: Jul. 11, 2006

(86) PCT No.: PCT/CA2006/001112
§ 371 (c)(1),
(2), (4) Date: Feb. 18, 2009

(87) PCT Pub. No.: WO2007/006136
PCT Pub. Date: Jan. 18, 2007

(65) Prior Publication Data
US 2009/0203195 A1     Aug. 13, 2009

Related U.S. Application Data

(60) Provisional application No. 60/697,532, filed on Jul. 11, 2005.

(51) Int. Cl.
*H01L 21/00* (2006.01)

(52) U.S. Cl. .............. 438/22; 438/48; 438/50; 438/87; 438/584; 257/E23.01; 257/E23.025; 257/E27.129; 257/E27.151; 257/E51.027; 977/815; 977/817; 977/823; 977/834

(58) Field of Classification Search .............. 438/22, 438/48–50, 57, 584; 257/E21.003, 23.01, 257/25, 33, 27.129–146, 151, 29.089, 51.027; 977/815–823, 824
See application file for complete search history.

(56) References Cited

U.S. PATENT DOCUMENTS

| 5,262,357 A | 11/1993 | Alivisatos et al. |
| 6,353,083 B1 | 3/2002 | Inbasekaran et al. |

(Continued)

FOREIGN PATENT DOCUMENTS

WO     WO 99/37832     7/1999

OTHER PUBLICATIONS

Ding et al "Synthesis of HgS and PbS nanocrystals in a polyol solvent by microwave heating" Microelectronic Engineering, vol. 66, Issue 1-4, May 2003, pp. 46-52.

(Continued)

*Primary Examiner* — Michael S Lebentritt
(74) *Attorney, Agent, or Firm* — J. Wayne Anderson; Sonia Patenaude; Jason Davis (57) ABSTRACT

Hybrid semiconductor materials have an inorganic semiconductor incorporated into a hole-conductive fluorene copolymer film. Nanometer-sized particles of the inorganic semiconductor may be prepared by mixing inorganic semiconductor precursors with a steric-hindering coordinating solvent and heating the mixture with microwaves to a temperature below the boiling point of the solvent.

19 Claims, 8 Drawing Sheets

U.S. PATENT DOCUMENTS

| | | | |
|---|---|---|---|
| 6,441,395 B1* | 8/2002 | Yu et al. | 257/40 |
| 6,514,632 B1 | 2/2003 | Woo et al. | |
| 6,703,780 B2 | 3/2004 | Shiang et al. | |
| 6,821,337 B2 | 11/2004 | Bawendi et al. | |
| 6,864,111 B2* | 3/2005 | Yu et al. | 438/22 |
| 7,019,391 B2* | 3/2006 | Tran | 257/678 |
| 7,399,429 B2* | 7/2008 | Liu et al. | 252/301.4 R |
| 7,445,671 B2* | 11/2008 | Sunkara et al. | 117/40 |
| 7,446,335 B2* | 11/2008 | Kortshagen et al. | 257/51 |
| 7,557,372 B2* | 7/2009 | Yang et al. | 257/40 |
| 2009/0294964 A1* | 12/2009 | Higashi et al. | 257/741 |

OTHER PUBLICATIONS

Firth et al "Microwave Assisted synthesis of CdSe nNanocrystals For Straightforward Integration Into Composite Photovoltaic devices" J. Mater. Chem, 2005, 15, 4367-4372.

Ding et al "Synthesis and Characterization of Alternating Copolymers of Fluorene and Oxadiazole", Amer Chem Soc 2002 vol. 35 pp. 3474-3483.

Li et al "Synthesis and Properties of Random and Alternating Fluorene/Carbazole Copolymers for Use in Blue Light-Emitting Devices" Amer. Chem. Soc. 2004, 16, p. 2165-2173.

* cited by examiner

HYBRID NANOCOMPOSITE SEMICONDUCTOR MATERIAL, AND METHOD OF PRODUCING INORGANIC SEMICONDUCTOR THEREFOR

CROSS-REFERENCE APPLICATIONS

This application is a National Stage application of PCT Application PCT/CA2006/001112 filed 11 Jul. 2006 which claims benefit of U.S. Provisional Application 60/697,532 filed Jul. 11, 2005.

FIELD OF THE INVENTION

The present invention is directed to hybrid organic/inorganic semiconductor materials and to methods of producing inorganic semiconductors therefor.

BACKGROUND OF THE INVENTION

Since the first report of a semiconductor p-n junction solar cell from Bell Laboratories more than a half a century ago, silicon (amorphous, polycrystalline or monocrystalline) has dominated the photovoltaic market with nearly 99% market share. More than 90% of photovoltaic panels (sold and installed) are based on crystalline (mono and polycrystalline) silicon. For aesthetic and for budgeting reasons, crystalline based solar cells are not the most suitable photovoltaic technology. For this reason, the various thin film-based photovoltaic panels are expected to take over crystalline silicon as the dominant technology in the future. For example, thin film technology uses two orders of magnitude less photovoltaic material, and the process of fabrication is simpler. For crystalline silicon, the cost of photovoltaic materials and their processing accounts for up to 50% of the total cost of the device. Since processing crystalline silicon requires the use of high temperature (up to 2000° C. or more) and high vacuum, costs are expected to keep rising.

State of the art mono-crystalline solar cells provide power efficiency of about 24%. However, even after several decades of intense R&D the cost of electricity production from solar energy is still about 10 times higher than fossil fuel-based power generation. Silicon-based photovoltaic technology has greatly benefited from the development of mass production of high quality silicon wafers for the microelectronic industry. However, because of its indirect energy band gap, silicon is not an efficient light absorption material in comparison with direct band gap semiconductors with similar characteristics. Thus, relatively thick film (several hundred micrometers) of expensive high purity silicon is required to absorb about 90% of impinging solar radiation. In the case of thin film technologies, photovoltaic materials require films that are only 0.1 to 1 micrometer thick.

It is generally believed that the ideal solar cell material would have the following characteristics: (i) direct energy band-gap of about 1.4 eV; (ii) readily available raw materials; (iii) amenable to an easy and reproducible deposition technique suitable for large area production; (iv) high light absorption coefficient and good photovoltaic conversion efficiency; and, (vi) long-term stability.

Among alternative active materials to silicon, organics have received attention. Since the first report about 20 years ago of a homojunction (single layer) organic-based cell with an efficiency of 1%, several single layer thin film photovoltaic devices based on small molecules have been reported. Processing and tunability of organic-based photovoltaic materials have potential advantages over silicon in the development of affordable and efficient photovoltaic cells. Polymers may be processed and fabricated cost effectively. Furthermore, they potentially provide flexibility in chemical tailoring to obtain desired properties. Another advantage of organic materials is their high light absorption coefficient. In spite of these advantages, solar energy conversion efficiencies reported so far on organic photovoltaic cells are much lower than the 24% efficiency obtained with mono-crystalline silicon based solar cells.

Heterojunction active layers formed from a blended donor (D) acceptor (A) nanocomposite material where the length scale of the blend is similar to the exciton length have received some interest recently. Heterojunctions provide large interfacial area within a bulk material in which any point is within nanometers of the D/A interface. This may permit a near ideal charge separation and charge transfer. However, blending has not lead to a significant enhancement in power conversion efficiency. One of the main bottlenecks is the lack of efficient charge recuperation leading to significant charge recombination.

In spite of all the efforts geared toward the development of processable semiconductive polymers, carrier mobility is still about 3 orders of magnitude lower than inorganic semiconductors. This limits the efficiency of charge transfer to the electrode. The low intrinsic carrier mobility of plastic materials is considered to be the main obstacle in achieving high efficiency in organic solar cells.

Because of their high surface area, inorganic nanomaterials are also receiving attention. Hybrid nanomaterials may combine the high charge mobility of inorganic materials with the flexibility of the organic materials.

Use of nanostructured active material with high surface-to-bulk ratio, combined with possibility of optoelectronic properties tunability, have been proposed to enhance photovoltaic efficiency. The larger active surface area in hybrid nanocomposites allows maximizing the harvesting of incident solar energy. One possible avenue is to use nanostructured hybrid materials composed of solution based inorganic nanoparticles interfaced with conductive media. An overall conversion efficiency of nearly 8% with a 10 μm film composed of a few nm $TiO_2$ particles coated with a dye has been reported. Although dye sensitized solar cell technology has attracted large interest from both academia and industry, it is still hindered by some stability issues. Replacing the solution medium with a polymeric matrix has led to some promising devices. A solid-state dye-sensitized solar cell (DSSC) consisting of three active layers (organic dye as light absorber, nanocrystalline metal oxide as electron transporter and an organic hole transporting film) has been reported to have a power conversion efficiency of 2.5%.

A blend of CdSe nanorods and a conjugated polymer has been reported to provide a power conversion efficiency of 1.7%. Good photovoltaic response (external quantum efficiency of 20%) on a hybrid film of hole conductor $CuInS_2$ nanoparticles imbedded in an electron conductor matrix has also been reported. However in such photovoltaic materials, the only component that permits tunability is the inorganic semiconductor component. The energy gap of the inorganic semiconductor material is tunable by varying nanocrystal particle size without changing the remaining properties (such tunability has not been demonstrated even in inorganic semiconductor based solar cells).

All inorganic photovoltaic nanocomposites-based solar cells have been reported providing advantages over hybrid nanocomposites. However, laboratory power conversion efficiencies are still low, and fabrication processes are not scalable.

There remains a need for semiconductor materials having good power efficiency based on thin film technology.

SUMMARY OF THE INVENTION

According an aspect of the invention, a semiconductor material is provided comprising an inorganic semiconductor incorporated into a film comprising a hole-conductive fluorene copolymer.

According to another aspect of the invention, there is provided a process for preparing nanometer-sized particles of an inorganic semiconductor comprises: mixing inorganic semiconductor precursors with a steric-hindering coordinating solvent, the solvent having a boiling point; and heating the mixture with microwaves to a temperature below the boiling point of the solvent.

The semiconductor material comprises an inorganic semiconductor incorporated into a film comprising a hole-conductive fluorene copolymer. Advantageously, energy levels (e.g. ionization energy (IP), electro-affinity (EA) and energy gap (Eg)) of both the inorganic semiconductor and the hole-conductive fluorene copolymer may be varied to control and optimize electron hole and conductive pathways thereby increasing power conversion efficiency of the semiconductor material.

The inorganic semiconductor may be n-type or p-type. Inorganic semiconductors include, for example, CdS, GaS, ZnS, CdSe, GaSe, ZnSe, CdTe, GaTe, SiC, Si, ClS, GaAs, PbS, PbSe, CuInSe, CuInS or a mixture thereof. Inorganic semiconductors are preferably particles, more preferably crystals, having a particle size in the nanometer range, preferably in a range of about 1-100 nm, for example about 2-10 nm. The energy gap of the inorganic semiconductor may be tuned by varying particle size, while retaining other chemical and/or physical properties. Inorganic semiconductor particles may be any suitable shape, for example, substantially spherical or substantially rod-like.

Nanometer-sized inorganic semiconductor particles may be prepared by any suitable method. For example, the so-called TOPO method uses heating above 200° C. and numerous steps to prepare monodisperse CdS, CdSe and CdTe nanoparticles (Murray C B, Norris D J, Bawendi M G, Synthesis and characterization of nearly monodisperse CdE (E=sulfur, selenium, tellurium) semiconductor nanocrystallites. *J. Am. Chem. Soc.* 1993, 115:8706-8715). Numerous variants of this method have been reported. Other methods used to fabricate semiconductor nanoparticles include sonochemistry, microemulsion, sol-gel and microwave techniques.

A particularly simple and efficacious method involves mixing inorganic semiconductor precursors with a steric-hindering coordinating solvent, preferably in the absence of surfactant, and heating the mixture with microwaves to a temperature below the boiling point of the solvent. The use of microwaves rather than other energy sources (e.g. ultrasound, convenction, etc.) permits even heating and precise adjustment of reaction temperature to a temperature lower than the boiling point of the solvent thereby reducing the risk of superheating the solvent. Importantly, the use of a steric-hindering coordinating solvent reduces agglomeration of smaller particles into larger aggregates. Particle size may be regulated by controlling reaction time. Reaction times on the order of less than about one minute can result in particles having average diameters of about 2 nm, while reaction times on the order of longer than about ten minutes can result in particles having average diameters of about 6 nm. Average diameter is directly related to heating time. Control of particle size provides the opportunity to tune energy levels in order to optimize photovoltaic properties of the inorganic semiconductor.

Advantageously, the microwave method can make use of less hazardous starting materials, is more energy efficient, is lower cost, does not require the use of surfactants, requires only one step under ambient conditions, produces little or no waste as recovered solvent and byproducts may be re-used, produces a product mixture that can be directly integrated into active devices, is conducive to large scale preparation, and permits fine tuning of particle size. In addition, this method permits preparation of stable solutions of inorganic semiconductor, which appear resistant to oxygen and moisture and provides luminescent materials when prepared and handles in air. Nanocrystalline particles of inorganic semiconductors having near band-edge photoemission may be prepared.

Inorganic semiconductor precursors include compounds or elements containing one or more components of the inorganic semiconductor. Two or more precursors may be reacted or co-precipitated to form the inorganic semiconductor. For example, one precursor may be a pure element (e.g. S, Se, Te), an organo-metalloid compound (e.g. thiourea, selenourea) or an inorganic compound (e.g. $SeCl_4$), and the other precursor a compound (e.g. a salt) containing another component of the inorganic semiconductor (e.g. Cd, Pb). The other precursor may comprise, for example, Cd acetate or Pb acetate. The solvent advantageously has a moderately high dipole moment acting as a susceptor for microwave radiation. The solvent advantageously acts as a capping agent to inhibit aggregation. The solvent may be, for example, cyclohexanone, dimethylformamide (DMF).

Varying the chemical structure of the hole-conductive fluorene copolymers permits wider control of energy levels, e.g. electron affinity (EA), ionization potential (IP) and bandgap (Eg). Preferably, the fluorene copolymers comprise fluorene monomers copolymerized with anthracene, oxadiazole or carbazole monomers, more preferably oxadiaxole or carbazole monomers. Such copolymers may be synthesized by methods described in Ding et al. ("Synthesis and characterization of alternating copolymers of fluorene and oxadiazole" *Macromolecules.* 35, 3474-3483 (2002), the disclosure of which is herein incorporated by reference) or Li et al. ("Synthesis and Properties of Random and Alternating Fluorene/Carbazole Copolymers for Use in Blue Light Emitting Devices", Y. Li, J. Ding, M. Day, Y. Tao, J. Lu, M. D'iorio, *Chem. Mater.,* 16(11), 2165-2173 (2004), the disclosure of which is herein incorporated by reference). Alternating copolymers of a fluorene with anthracene, carbazole or oxadiazole may be mentioned specifically. Energy bandgaps of these copolymers may be tuned by changing the ratio of the fluorene and anthracene, carbazole or oxadiazole groups. For example, the ratio of fluorene to anthracene, carbazole or oxadiazole may be 10:1 to 1:10, for example 4:1 to 1:1.

Fluorene copolymers of formula I and II may be produced by the methods noted above:

wherein R is —(CH$_2$)$_7$CH$_3$, n is a non-zero number between 0 and 1, m is 1, 2, 3 or 4, p is 2, 3 or 4, and X is Table 1 provides a list of some individual fluorene copolymers of formula (I).

TABLE 1

| Identifier | X | M | Ratio of fluorene to X |
|---|---|---|---|
| PFA1:1 | | 1 | 1:1 |
| PFA2:1 | | 2 | 2:1 |

TABLE 1-continued

| Identifier | X | M | Ratio of fluorene to X |
|---|---|---|---|
| PFA3:1 | | 3 | 3:1 |
| PFA4:1 | | 4 | 4:1 |
| PFOx1:1 | | 1 | 1:1 |
| PFOx2:1 | | 2 | 2:1 |

TABLE 1-continued

| Identifier | X | M | Ratio of fluorene to X |
|---|---|---|---|
| PFOx3:1 |  | 3 | 3:1 |
| PFOx4:1 |  | 4 | 4:1 |
| PFCz1:1 |  | 1 | 1:1 |
| PFCz2:1 |  | 2 | 2:1 |
| PFCz3:1 |  | 3 | 3:1 |
| PFCz4:1 |  | 4 | 4:1 |

Table 2 provides a list of some individual fluorene copolymers of formula (I).

TABLE 2

| Identifier | p | Ratio of fluorene to oxadiazole |
|---|---|---|
| PFOx3:2as | 2 | 3:2 |
| PFOx4:2as | 3 | 4:2 |
| PFOx5:2as | 4 | 5:2 |

The energy bandgap (Eg) of fluorene copolymers is preferably less than about 4 eV, more preferably less than about 3.6 eV. Generally, the bandgap is preferably as low as possible. Table 3 provides various energy levels for selected fluorene polymers and other materials. It is evident that the energy levels vary with composition of the polymer, thereby providing the opportunity to tune energy levels for optimizing photovoltaic properties.

TABLE 3

Stable thin films of semiconductor material may be cast directly from a liquid medium with only one evaporation step, for example by spin coating, ink-jet printing or dip-coating. The fluorene copolymer and inorganic semiconductor may be combined in a liquid medium, the liquid medium cast on a substrate (e.g. a glass plate), and the liquid evaporated to provide a thin film of semiconductor material on the substrate. The liquid medium preferably comprises a solvent for the copolymer, for example toluene or cyclohexanone. Conveniently the solvent may be the same solvent used in the preparation of the inorganic semiconductor. The reaction mixture of the inorganic semiconductor may be used directly by adding the fluorene copolymer to it and casting the resulting mixture onto the substrate. If the reaction mixture is used directly, some of the solvent is preferably evaporated, preferably to less than 15%, more preferably to about 10% of its initial volume.

Advantageously, it is not necessary to exchange the capping group (e.g. cyclohexanone) with another (e.g. pyridine) since inter-particle separation does not become significantly smaller when compared to trioctylphosphine, therefore, transport properties are not enhanced simply by the exchange of surface functionality as a result of the exchange of capping groups. Annealing the film may improve transport characteristics of the semiconductor material, however, restrictions imposed by the polymer in the semiconductor material prohibit high temperature annealing. Size selective precipitation is also not necessary since in a photovoltaic cell a narrow size distribution is not necessarily beneficial.

By controlling the concentration of copolymer in the liquid medium, as well as casting parameters such as speed of rotation during spin coating, film thickness can be varied as desired. Preferably, thin films have a thickness in a range of about 50-250 nm. Films are of a high enough quality to be used directly in a photovoltaic device. Morphologies of inorganic semiconductor particles in thin films of the semiconductor material are similar to particle morphologies in films of pure inorganic semiconductor.

Thin films of semiconductor materials of the present invention are useful as the active layer in photovoltaic devices and organic light emitting diodes. In one embodiment, fabrication of photovoltaic devices comprises deposition of the semiconductor material on a glass substrate that is pre-coated with a transparent conducting film (e.g. indium tin oxide (ITO)) and a metal electrode (e.g. aluminum). One side of the glass substrate is covered with transparent conducting film in order to have conductivity. The other side of the substrate is covered with a metal electrode to allow the formation of a circuit.

Further features of the invention will be described or will become apparent in the course of the following detailed description.

BRIEF DESCRIPTION OF THE DRAWINGS

In order that the invention may be more clearly understood, embodiments thereof will now be described in detail by way of example, with reference to the accompanying drawings, in which.

DESCRIPTION OF PREFERRED EMBODIMENTS

Example 1

Preparation of Inorganic Semiconductor Nanoparticles

1A: CdS Nanoparticles

CdS nanoparticles were prepared using cadmium acetate (Aldrich) and thiourea (Aldrich) as precursors. 50 mL of DMF (Aldrich) in a flask was degassed for 30 minutes under $N_2$. Cadmium acetate (0.0355 g of $Cd(OAc)_2.H_2O$) and thiourea (0.0092 g) were combined into the DMF and stirred until the reagents were completely dissolved. The solution was then placed in a microwave equipped with an opening to allow a condenser out of the microwave chamber (Model Mars 5×CEM system with a 2.45 GHz working frequency). Heating temperature and hold time were controlled to provide tunability in particle size distribution. Temperature control was provided with a fibre optic thermocouple placed near the solution. For particles of 5 nm in diameter, the ramp time was 5 minutes, the final temperature was 90° C. and the hold period was 30 minutes. As soon as the hold period was complete, the flask is put into an ice bath with continued stirring in order to rapidly reduce the temperature. Higher temperatures and longer hold times give larger particles.

A similar procedure could be used to prepare CdSe using selenourea rather than thiourea, however, selenourea is highly toxic and sensitive to moisture so some precautions would be required.

1B: CdSe Nanoparticles

Microwave assisted synthesis of CdSe nanoparticles was carried out in a Mars 5×CEM system with a 2.45 GHz working frequency. Temperature control was provided with a fibre optic thermocouple enclosed in a threaded side arm near the solution. $Cd(OAc)_2$—$H_2O$ (0.5 g, 1.9 mmol) and Se (0.15 g, 1.9 mmol) were suspended in cyclohexanone (50 mL). The mixture was heated to 145° C. for varying lengths of time (between 30 seconds and 15 minutes) to control particle size. The solution was decanted from the unreacted starting materials and the volume then reduced to 5 mL by evaporation providing a product mixture consisting of approximately 50 mg of CdSe per mL of solvent.

CdS, PbS and PbSe were also be prepared by this method by adjusting the reaction temperature and precursors.

When alternative ketones were used in lieu of cyclohexanone, it became apparent that the relative acidity of the α-carbon of the various ketones influenced the formation of nanocrystals (Table 4). For example, when 2-pentanone or 3-pentanone was the reaction solvent there was no evidence of nanoparticle formation. However when 2,4-pentanedione was substituted for the reaction solvent, CdSe nanocrystals quickly formed, although it was difficult to isolate small particles. The large particle size is possibly a result of the significantly smaller steric hindrance afforded by the diketone group as compared to the hexanone group.

acid does form is substantiated with the substitution of $CdCl_2$ for $Cd(OAc)_2$. In this case the reaction proceeds to a given point, and then fails to continue. HCl, being a strong acid, as apposed to HOAc, reaches its equilibrium concentration, and inhibits the further liberation of $Cl^-$. When trimethyl amine is added to the reaction mixture, a white precipitate forms ($HCl.N(CH_2CH_3)_3$) and the formation of CdSe resumes. Since it has been established that HCl does form when $CdCl_2$ is used as the cadmium precursor, it is inferred that HOAc forms when $Cd(OAc)_2$ is used.

Gas chromatography-mass spectroscopy (GC-MS) studies of the product mixture provides mass spectra that can be associated with two complexes in addition to cyclohexanone. One mass spectrum can be assigned to the cyclohexanone adduct of selenium, Se.2cyclohexanone. A second mass spectrum associated with an organic by-product of cyclohexanone is also evident. This spectrum includes signals attributable to the fragments associated with McLafferty rearrangement, a signature of ketone decomposition. Further investigation of this complex did not establish the identity more accurately.

Example 2

Preparation of Thin Films of Semiconductor Material

2A: Films of CdS Embedded in PFOx4:1

An alternating copolymer of 9,9-dioctylfluorene and oxadiazole having a fluorene:oxadiazole ratio of 4:1 (PFOx4:1)

TABLE 4

| Solvent | | $pK_a$ | Boiling Point | Reactivity |
|---|---|---|---|---|
| cyclohexanone ↔ cyclohexenol | | 16.7 | 155° C. | Nanoparticles formed |
| 2,4-pentanedione ↔ enol form | | 8.9 | 139° C. | Nanoparticles formed |
| 3-pentanone ↔ enol form | | 19-20 | 101° C. | No visible reaction |
| 2-pentanone ↔ enol form | | 19-20 | 102° C. | No visible reaction |

Further investigation, that included the synthesis of CdS and PbS, established that the low boiling point of the 2-pentanone or 3-pentanone did not correlate to the lack of nanoparticle formation. In cyclohexanone the reaction of $Cd(OAc)_2$ and S proceeds at temperatures below 100° C. as does the reaction of $Pb(OAc)_2$ with S. There was no evidence of nanocrystalline formation in the 2-pentanone or 3-pentanone for these two systems. When a small amount of cyclohexanone was mixed into the pentanone, the reaction was initiated. Subsequent to addition of cyclohexanone, both formation of PbS and CdS was evident at temperatures below 100° C. These experiments show that the low boiling temperature of 2-pentanone or 3-pentanone is not responsible for the inability to form nanoparticles.

Without being held to any particular theory of action, the mechanism of the reaction is thought to follow from tautomerization of the ketone to the enol. This equilibrium can be catalyzed by acid or base. The catalytic group may be a product of the decomposition of $Cd(OAc)_2$. Evidence that was prepared in accordance with Ding et al. as indicated previously. A solution was prepared containing both PFOx4:1 and the CdS nanoparticles from Example 1A. Thus, PFOx4:1 was dissolved in toluene in a weight concentration of 0.017% or 0.17 g/L. CdS particles were used as prepared in DMF and were present in a concentration of 0.0025M.

Thin films were prepared by solvent evaporation on glass substrates. The surface of the glass was first rinsed with acetone and allowed to dry. A freshly made solution of PFOx4:1 and CdS was placed on the glass surface until it completely covers it. The so-formed liquid film was then partially covered with a petri dish and placed on a hot plate at a temperature kept lower than 60° C. A thin film of the semiconductor material comprising CdS and PFOx4:1 was ready when all of the solvent evaporated.

2B: Films of CdSe Embedded in P(F3-alt-Cz)

Poly(9,9-dioctylfluorene-2,7-diyl-alt-9-octyl-carbazole-3,6-diyl) in a ratio of three fluorene to one carbazole, [P(F3- alt-Cz)] was synthesized in accordance with Li et al. as previously indicated. P(F3-alt-Cz) (0.010 g, 6.8×10$^{-5}$ mmol) was then introduced to a 2 mL portion of the product mixture from Example 1B. When P(F3-alt-Cz) was included in situ during CdSe evolution, there was no observable difference in the characteristics of the final product.

Example 3

Characterization of Inorganic Semiconductor Nanoparticles and Thin Films of Semiconductor Material Scanning Electron Microscopy (SEM)

Figure 1A:
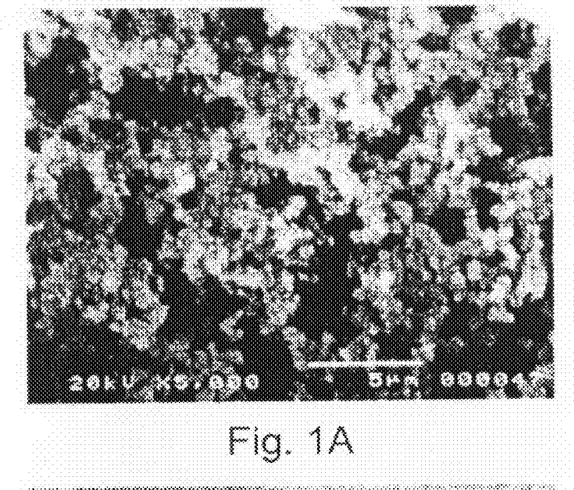
FIG. 1A depicts a scanning electron micrograph (SEM) of CdSe.

A scanning electron micrograph (SEM) of CdSe nanoparticles of Example 1B is depicted in FIG. 1A. In three dimensions, the particles appear spherical having a diameter on the order of 50 nm.

Figure 1B:
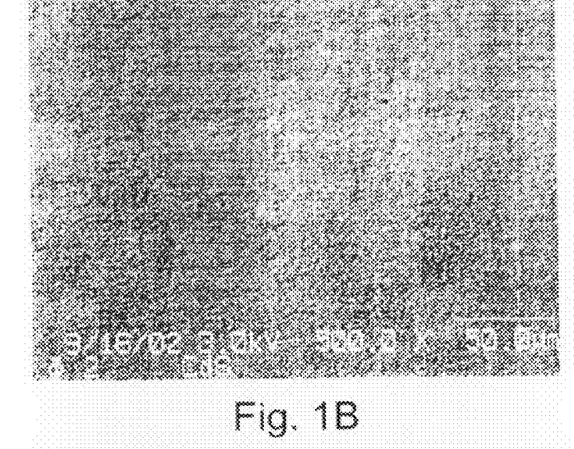
FIG. 1B depicts a scanning electron micrograph (SEM) of a thin film of CdS embedded in PFOx4:1 at 500×.
Figure 1C:
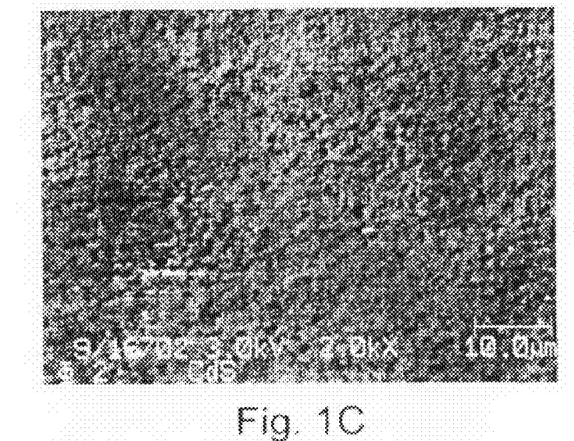
FIG. 1C depicts a scanning electron micrograph (SEM) of a thin film of CdS embedded in PFOx4:1 at 2000×.

Scanning electron micrographs of a thin film of CdS embedded in PFOx4:1 (FIGS. 1B (500× magnification) and 1C (2000× magnification)) indicate that the film is quite smooth.

Transmission Electron Microscopy (TEM)

To prepare samples for TEM, a small amount of each sample was suspended in a solvent (isopropyl alcohol for CdS and acetone for CdSe) and shaken vigorously, for example by sonication. A drop of the resulting suspension was placed on a carbon-coated holey copper grid and dried in air. The dried grid was loaded in a double tilt sample holder. Samples were examined with a Philips CM20 STEM equipped with a Gatan UltraScan 1000 CCD camera, and an energy dispersive X-ray (EDXA) spectrometer INCA Energy TEM 200 or an Oxford Instruments Energy Dispersive X-ray Diffraction detector. TEM images were taken at 200 kV.

Figure 2A:
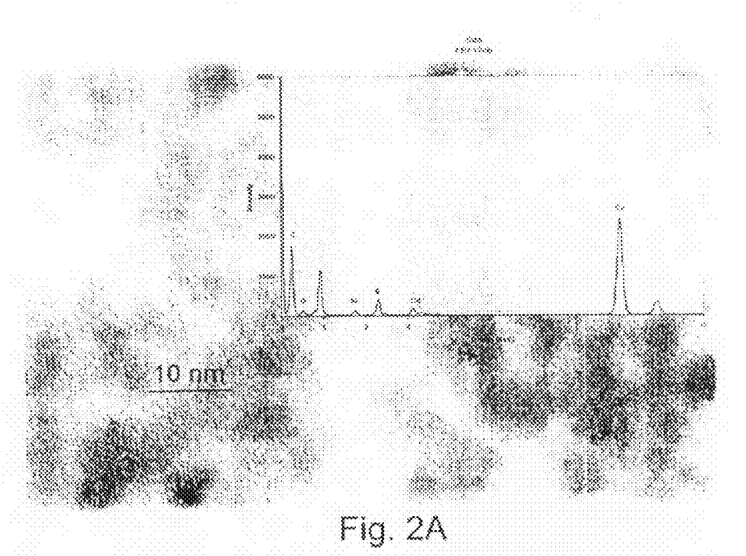
FIG. 2A depicts a transmission electron micrograph (TEM) of CdS nanoparticles, with an inset depicting an energy dispersive X-ray (EDXA) plot.
Figure 2B:
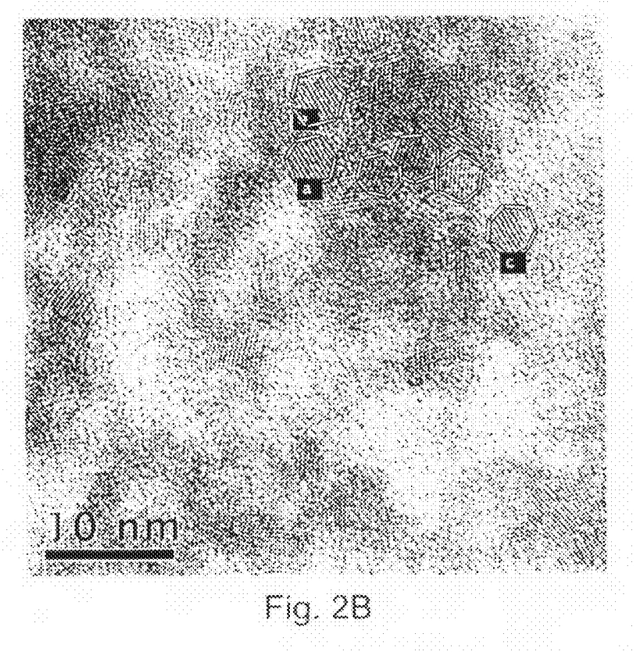
FIG. 2B depicts a bright field TEM image of CdSe nanoparticles at a scale of 10 nm.
Figure 2C:
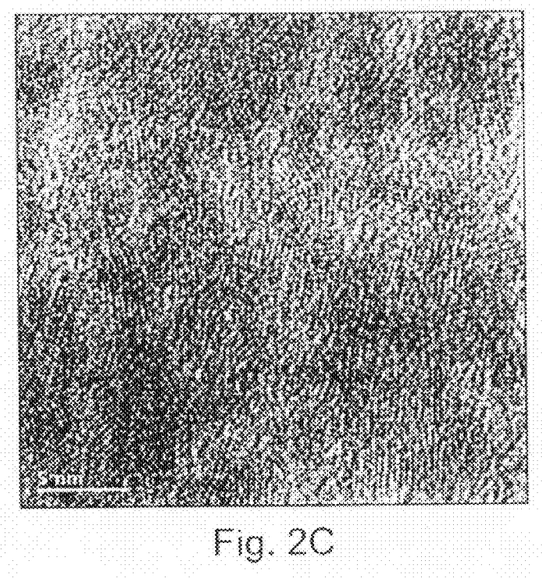
FIG. 2C depicts a high resolution TEM (HRTEM) image of CdSe nanoparticles at a scale of 5 nm.

FIG. 2A depicts a TEM image of CdS nanoparticles of Example 1A showing the presence of nanoparticles in a 3-5 nm range. The presence of Cd and S was confirmed by EDXA as shown in the inset in FIG. 1A. FIG. 2B depicts a transmission electron micrograph (TEM) image of CdSe nanoparticles of Example 1B. This 2-D perspective is consistent with the SEM image (FIG. 1). Large spherical assemblies are evident. Closer inspection reveals that the clusters consist of assemblies of hundreds of smaller nanoparticles. These smaller particles are approximately 30 Å in diameter. FIG. 2C is a high resolution TEM (HRTEM) image of the same CdSe nanoparticles.

Smaller nanocrystals, for example a, b and c, are more apparent. As well, the striations that are the signature of crystalline material are evident. Such assemblies are desirable since an interconnection between nanoparticles does form, allowing for the means by which electrons may travel.

Crystallography of individual nanoparticles can be determined by carefully examining the one- (consisting of lines) or two-dimensional (consisting of rays of dots) lattice structures and also by measuring the lattice spacings. Due to random orientation of the particles, not every particle in the image reveals a 2-D symmetry lattice. The TEM data give interspacing distance (d) values of 0.342, 0.340 and 0.348 nm for nanoparticles a, b and c, respectively (FIG. 2C). These values are in agreement with the lattice parameters of a hexagonal structure ($a_0$=0.4299 nm, $d_{002}$=0.351 nm) and a cubic structure ($a_0$=0.6077 nm, $d_{100}$=0.351 nm) although electron diffraction data indicate that the cubic structure is the dominant phase. X-ray diffraction data also showed the presence of both hexagonal and cubic structures.

X-Ray Diffraction (XRD)

XRD measurements were made on a Cu-kα Bruker D8 diffractometer, calibrated for peak position using the NIST SRM 660a LaB$_6$ standard.

Figure 3A:
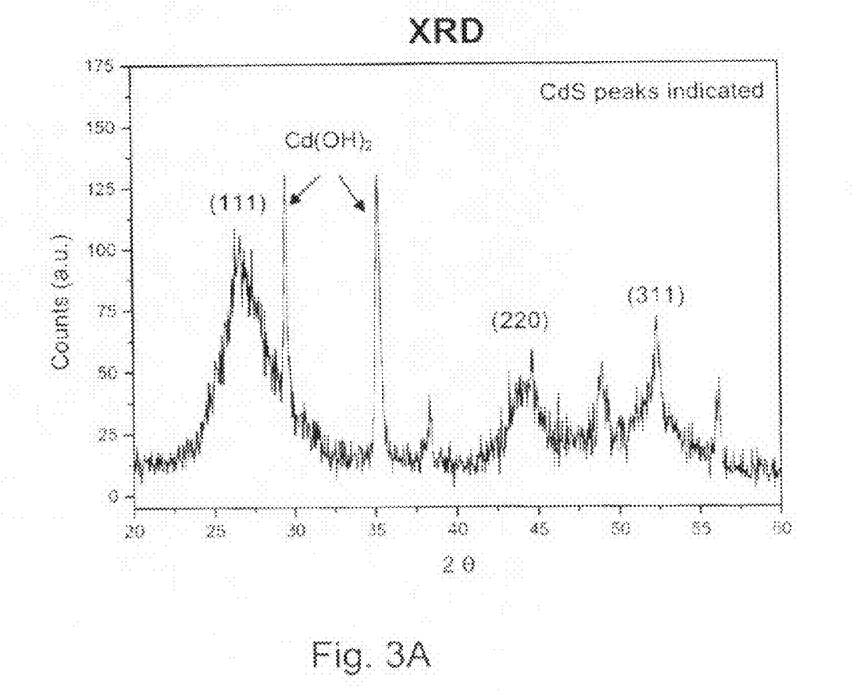
FIG. 3A depicts an X-ray diffraction (XRD) spectrum of CdS nanoparticles.
Figure 3B:
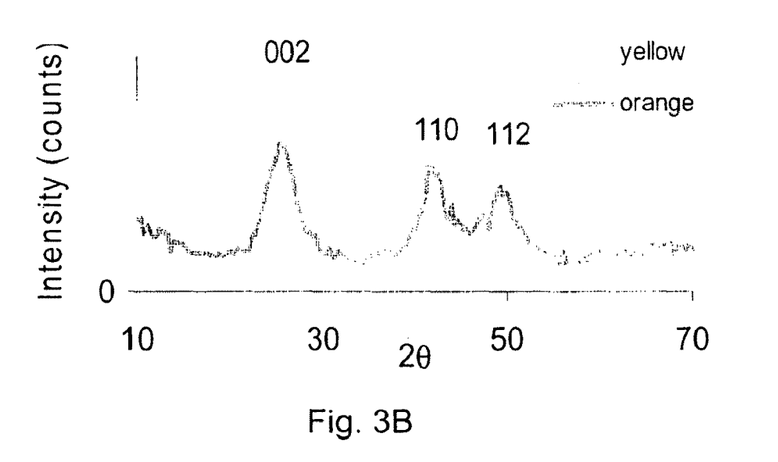
FIG. 3B depicts X-ray diffraction (XRD) spectra of CdSe nanoparticles obtained with less than 1 minute of microwave heating (upper) and more than three minutes of microwave heating (lower)

XRD spectrum analysis (FIGS. 3A and 3B) of CdS and CdSe nanoparticles shows the presence of CdS and CdSe nanocrystallites having a particle size in a range of about 5 nm, as estimated from the width of the diffraction line and Debye-Sherrer equation. The presence of Cd(OH)$_2$ in FIG. 3A is thought to be associated with an intermediate product of the reaction not completely removed during the cleaning step.

Ultraviolet/Visible (UV-Vis) and Photoluminescence Spectroscopy

UV-Vis spectra were obtained on a HP 8453 UV-Vis spectrophotometer (single beam). UV-Vis features (peak position) are often used to estimate indirectly the size of metallic and semiconductor particles. Solid samples were diluted in toluene before measurement. Photoluminescence spectra were obtained on a Spex Fluorolog 3 spectrometer.

UV-Vis spectra of CdS and CdSe nanoparticles (in DMF for CdS and cyclohexanone for CdSe), obtained at different hold times and heating temperatures, were measured at room temperature. The size of the particles is related to their energy gap Eg using the Brus equation (L. E. Brus, J. Chem. Phys. 80 (9), 1984, 4403):

$$E_g \equiv E - \frac{\hbar^2\pi^2}{2R^2}\left\{\frac{1}{m_e^*} + \frac{1}{m_h^*}\right\} - \frac{1.8e^2}{R\varepsilon}$$

where E is the bulk band gap of CdS, $\hbar$ is the Planck's constant, $m_e^*$ and $m_h^*$ are the effective mass of the electron and of the hole, $\in$ is the dielectric coefficient at optical frequencies, e is the elementary charge and R is the particle radius.

Figure 4A:
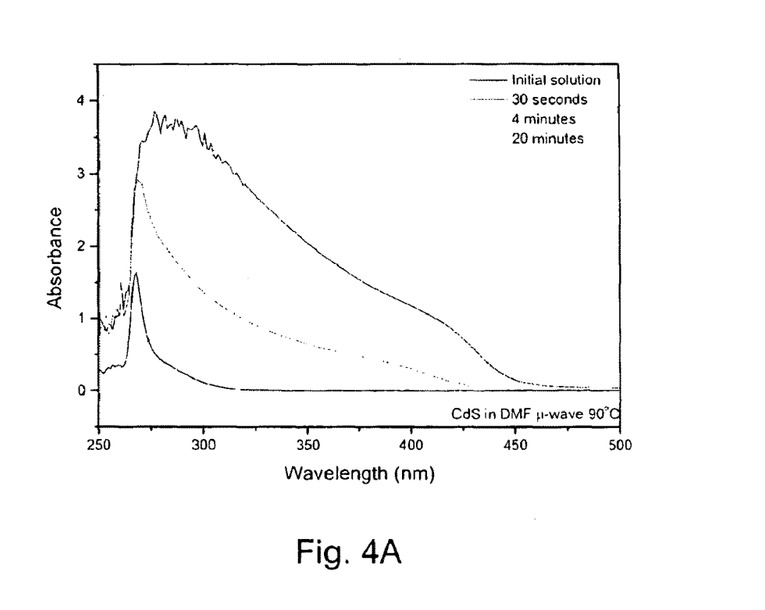
FIG. 4A depicts UV-Vis spectra of CdS nanoparticles in DMF using different hold times.

UV absorption spectra of CdS nanoparticle obtained under microwave heating at 90° C. for different heating duration (hold time) showed a red shift of the high wavelength onset (FIG. 4A). This shift is assigned to the increase in the average of the CdS nanoparticle size. In FIG. 4A, the order of the absorbance curves from lowest to highest is initial solution, 30 seconds, 4 minutes and 20 minutes.

Figure 4B:
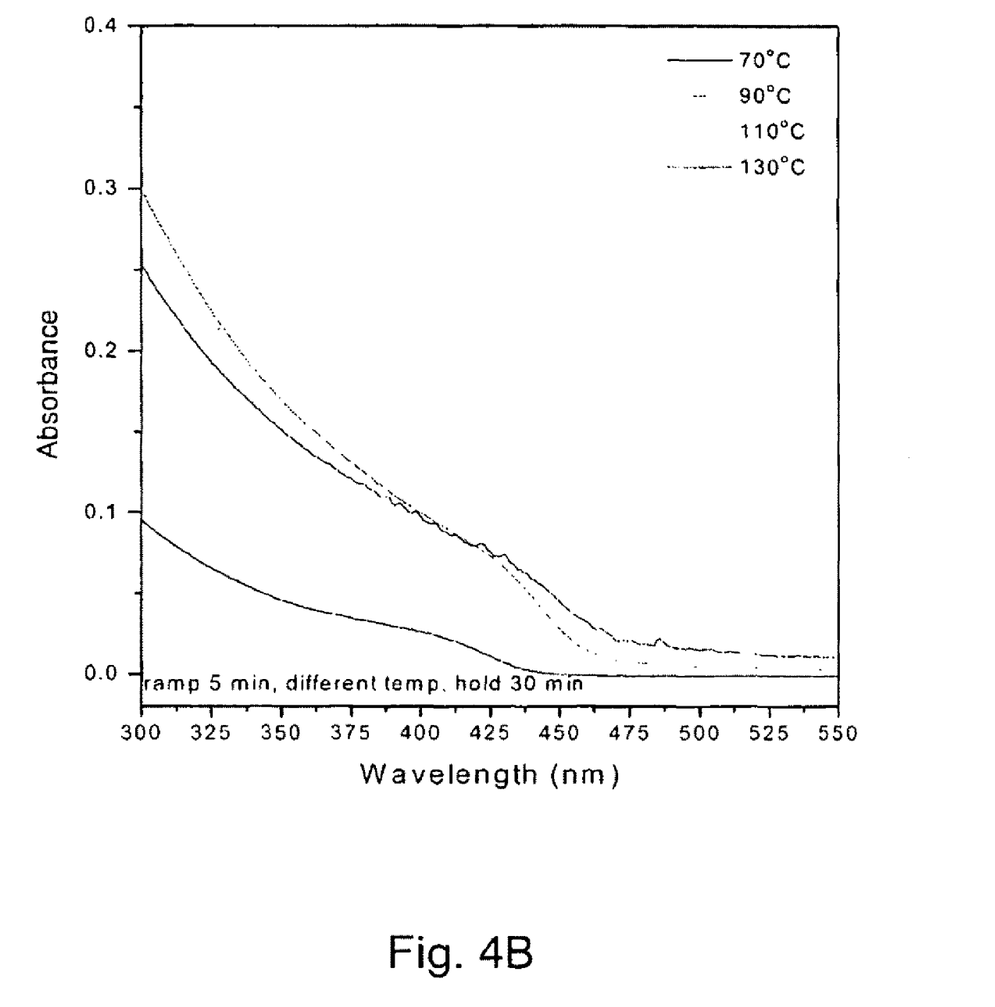
FIG. 4B depicts UV-Vis spectra of CdS nanoparticles in DMF using different heating temperatures.

Increasing the heating temperature also lead to increase in average particle size (FIG. 4B). In FIG. 4B, the order of the absorbance curves from lowest to highest is 70° C., 120° C., 90° C. and 110° C.

Figure 4C:
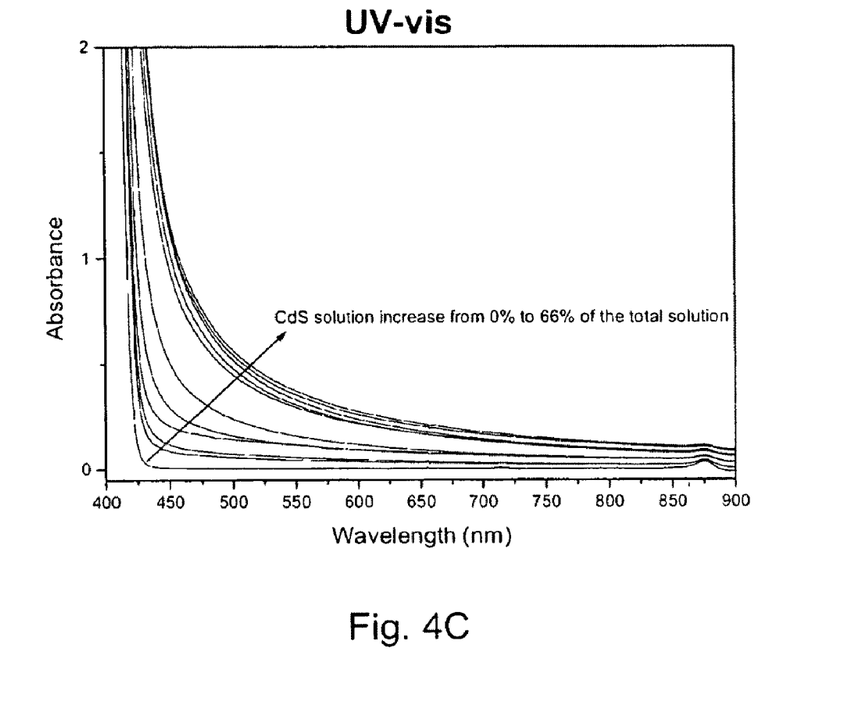
FIG. 4C depicts UV-Vis spectra of a combined solution of CdS and PFOx4:1.

FIG. 4C shows UV-Vis absorption spectra of mixtures of CdS nanoparticle in DMF with PFOx4:1 in toluene. DMF solutions of CdS having volumes of 0 to 2 ml were used, each solution having a CdS concentration of 0.0025 M. A volume of 1 ml of the toluene solution of PFOx4:1, the solution having a concentration of PFOx4:1 of 0.017 wt %. The presence of small CdS nanoparticle (about 5 nm) is confirmed by the position of the absorption peak (about 490 nm). Note that the absorption peak from the polymer didn't move before and after mixing the two solutions are mixed.

Figure 4D:
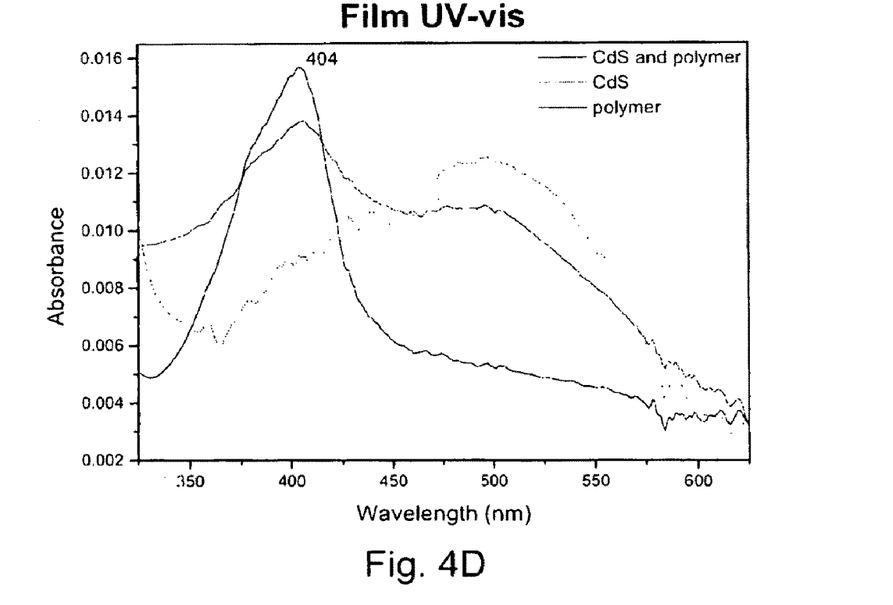
FIG. 4D depicts UV-Vis spectra of CdS, PFOx4:1 and a thin film of CdS in PFOx4:1.

FIG. 4D depicts UV-Vis spectra of a CdS solution, a solution of CdS and PFOx4:1 fluorene copolymer, and a thin film of CdS embedded in the PFOx4:1 fluorene copolymer. Based on the position of the CdS absorption, the size of the particles didn't change very much. Note that the absorption peak from the polymer film slightly shifted. It can be concluded that small CdS nanoparticles are stabilized within the polymer matrix.

Figure 4E:
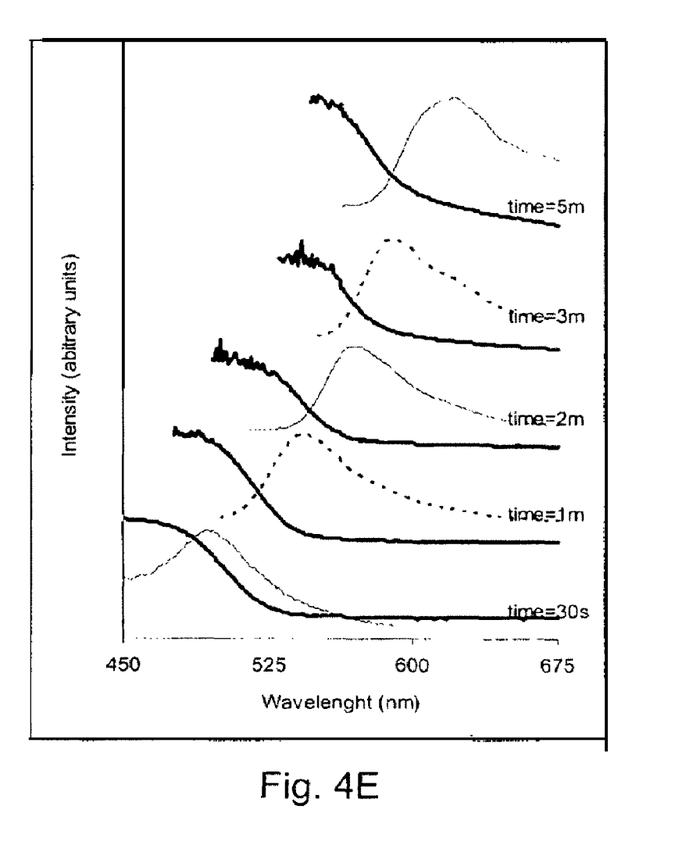
FIG. 4E depicts UV-Vis (-) and photoluminescence (---) spectra of CdSe nanoparticles in cyclohexanone.

Absorption studies of both solution and thin film samples of the CdSe establish quantum confinement. The wavelength of the onset of absorption varies from 475 nm to 610 nm depending on the reaction conditions. These values are significantly blue shifted when compared to bulk CdSe. Analysis of the spectra indicates that, although the nanoparticles associate in space into large spheres, their electronic wavefunctions do not overlap and thus the electron system is confined within the individual nanocrystals. Absorption spectra are consistent with nanoparticles on the order of 20 Å to 60 Å in diameter. Comparison of the absorption and emission characteristics of the solution spectra, demonstrate that the emission wavelength is red shifted by approximately 0.2 eV from the onset of absorption (FIG. 4E). This value is consistent with near band-edge emission, therefore radiative emission is not thought to be from deep level traps. The full width at half the maximum of the photoluminescence signal was independent of the particle size at 55±5 nm.

Figure 5:
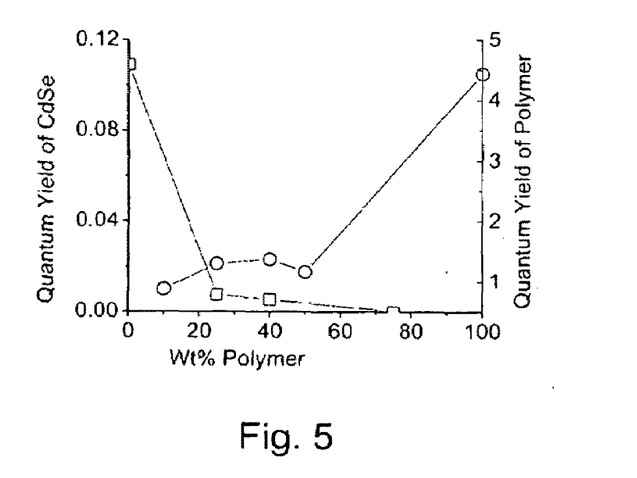
FIG. 5 depicts a graph of photoluminescence quantum yield (%) of CdSe (□) and P(F3-alt-Cz) (○) vs. wt % polymer when excited with a wavelength of 450 nm and 360 nm, respectively.

To help establish the interaction between the polymer and the nanocrystals, photoluminescence studies were undertaken. The photoluminescence efficiency of several samples of films incorporating increasing percent weights of CdSe in a P(F3-alt-Cz) matrix were measured. The quantum yield of the polymer when excited at 360 nm was measured with increasing % weight of CdSe (FIG. 5). As the percentage of CdSe increased the photoluminescence efficiency decays. It was not possible to eliminated Förster exiton transfer in this case since the energy of emission of the polymer does overlap with the absorption spectrum of the CdSe nanocrystals. With this material system, however, it was also possible to measure the change in photoluminescence efficiency of the CdSe nanocrystals with increasing weights of polymer. The emission peak related to radiative recombination within the CdSe is sufficiently well separated from the absorption onset of P(F3-alt-Cz) that it is feasible to excite the CdSe nanocrystals independently from the polymer simply by choosing excitation wavelengths greater than 400 nm. When the composite thin films were excited at 450 nm, it was possible to observe the emission signal of the CdSe nanocrystals only. Förster transfer from CdSe to the polymer is eliminated in this manner and thus we may infer hole transfer from CdSe to the polymer. Decay in the photoluminescence efficiency for the CdSe is observed in an analogous manner to the polymer photoluminescence quenching. FIG. 5 depicts the decay in photoluminescence quantum yield an goes toward establishing the interaction between P(F3-alt-Cz) and the CdSe nanocrystals.

Example 4

Photovoltaic Devices

Photovoltaic devices were fabricated in a three-step process. A blend of poly(3,4-ethylene dioxythiophene) and poly(styrene sulfonate), PEDOT-PSS, was spin cast to a thickness of 60 nm onto UV-ozone treated indium tin oxide (ITO). A solution of P(F3-alt-Cz)/CdSe of Example 1B was spin cast to a thickness of 200 nm, followed by the vacuum deposition of a 60 to 150 nm layer of aluminum (Al).

Figure 6:
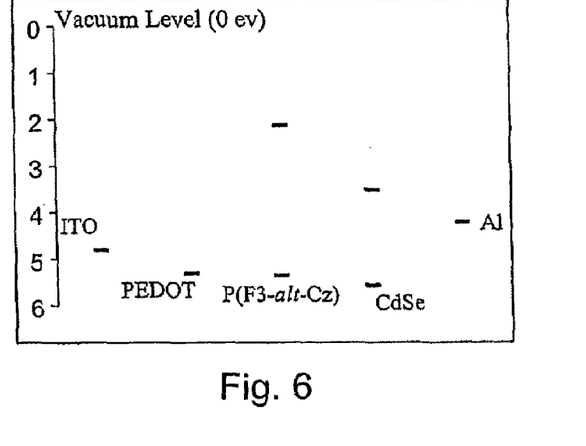
FIG. 6 depicts an energy diagram for ITO/[(F3-alt-Cz)(35 Å CdSe)]/Al photovoltaic device.

This material system has excellent electron affinity and ionization potential line-up with CdSe (FIG. 6). Transfer of electrons to CdSe from P(F3-alt-Cz) is favoured, while transfer of holes from P(F3-alt-Cz) to CdSe is marginally preferred. The work function of the aluminum electrode is aligned such that collection of electrons from conduction band of the CdSe nanocrystals is possible, while the indium tin oxide (ITO) electrode collects holes from the lowest unoccupied molecular orbital of the polymer.

Figure 7:
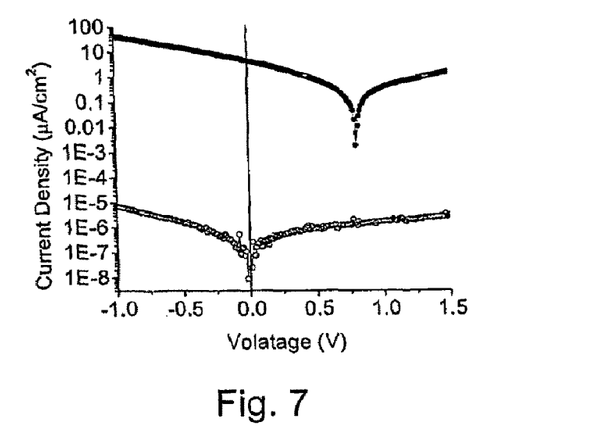
FIG. 7 depicts a semilogarithmic plot of current density ($\mu A\ cm^{-2}$) vs. voltage (V) for a CdSe/P(F3-alt-Cz) device in the dark (○) and illuminated by an AM 1.5 direct light source (●); and, FIG. 8 depicts a graph of photoresponse of photovoltaic devices containing P(F3-alt-Cz) (●), CdSe (□) and CdSe/P (F3-alt-Cz) (○) in the active layer.

FIG. 7 illustrates the current density as a function of voltage for a P(F3-alt-Cz)/CdSe device. Measurements were conducted in the dark and with the sample illuminated by an AM 1.5 direct light source. From analysis of the short-circuit current ($I_{sc}$=4.6 µA/cm$^2$) and open-circuit voltage ($V_{oc}$=800 mV) it is possible to establish the generation of a photocurrent. The device behaviour is consistent with a photovoltaic cell as there is an increase in current density with the introduction of light over the leakage current.

Figure 8:
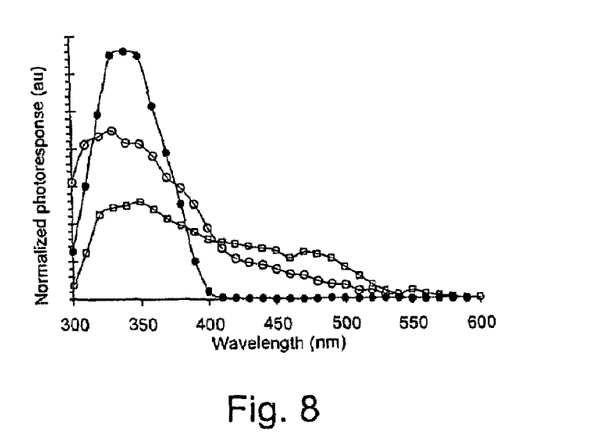

Analogous devices that omitted the polymer component in one case and the CdSe component in a second case were prepared to help establish the contribution from both the polymer and CdSe to the photovoltaic effect. The current-voltage response of the different samples was compared under narrow band illumination from 300 nm to 600 nm (FIG. 8). The device containing only P(F3-alt-Cz) in the active layer demonstrated a photoresponse only when illuminated at wavelengths less than 400 nm. The composite sample provided photocurrent when illuminated through to approximately 550 nm. The comparison of the spectral response of these devices correlates the photovoltaic behaviour to the hybrid material and not simply to the polymer component.

Other advantages that are inherent to the structure are obvious to one skilled in the art. The embodiments are described herein illustratively and are not meant to limit the scope of the invention as claimed. Variations of the foregoing embodiments will be evident to a person of ordinary skill and are intended by the inventor to be encompassed by the following claims.

The invention claimed is:

1. Process for preparing nanometer-sized particles of an inorganic semiconductor comprises: mixing inorganic semiconductor precursors with a steric-hindering coordinating solvent, the solvent having a boiling point; and heating the mixture with microwaves to a temperature below the boiling point of the solvent.

2. Process of claim 1, wherein the solvent is a susceptor for microwave radiation.

3. Process of claim 2, wherein the solvent is a capping agent that inhibits aggregation of the nanometer-sized particles.

4. Process of claim 3 wherein the solvent comprises cyclohexanone.

5. Process of claim 1 conducted without surfactant.

6. Process of claim 1, wherein reaction time is less than 1 minute.

7. Process of any claim 1, wherein reaction time is longer than 10 minutes.

8. Process of claim 1, wherein the inorganic semiconductor precursors comprise: a first precursor comprising a pure element, an organo-metalloid compound or an inorganic compound; and a second precursor comprising a compound containing another component of the inorganic semiconductor.

9. Process of claim 8, wherein the first precursor comprises S, Se, Te, Cu, In, thiourea, selenourea or SeCl$_4$.

10. Process of claim 9, wherein the second precursor comprises a salt.

11. Process of claim 9, wherein the second precursor comprises a salt of Cd or Pb.

12. Process of claim 9, wherein the second precursor comprises cadmium acetate or lead acetate.

13. Process of claim 1, wherein by-products and the solvent are reused.

14. Process of claim 1, comprising the additional step of incorporating the inorganic semiconductor into film of a hole-conductive fluorene copolymer.

15. Process of claim 14, wherein the fluorene copolymer is soluble in the steric-hindering coordinating solvent.

16. Process of claim 15, wherein the inorganic semiconductor is incorporated into the film of the fluorene copolymer by combining the inorganic semiconductor and the copolymer in a casting solvent, casting the casting solvent together with the copolymer and inorganic semiconductor on a substrate, and evaporating the casting solvent to provide a film of semiconductor material on the substrate.

17. Process of claim 16, wherein the casting solvent and the steric-hindering coordinating solvent are the same solvent.

18. Process of claim 17, wherein the inorganic semiconductor is not isolated from the steric-hindering coordinating solvent and the fluorene copolymer is combined directly into mixture of inorganic semiconductor and steric-hindering coordinating solvent before casting on to the substrate.

19. Process of claim 16, wherein the substrate comprises a glass plate.

* * * * *